United States Patent
Suda et al.

(10) Patent No.: US 12,512,325 B2
(45) Date of Patent: Dec. 30, 2025

(54) ETCHING METHOD AND ETCHING APPARATUS

(71) Applicant: Tokyo Electron Limited, Tokyo (JP)

(72) Inventors: Ryutaro Suda, Miyagi (JP); Takatoshi Orui, Hillsboro, OR (US); Kae Kumagai, Miyagi (JP); Maju Tomura, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 299 days.

(21) Appl. No.: 18/121,608

(22) Filed: Mar. 15, 2023

(65) Prior Publication Data
US 2023/0215691 A1 Jul. 6, 2023

Related U.S. Application Data

(63) Continuation-in-part of application No. PCT/JP2021/017481, filed on May 7, 2021.

(51) Int. Cl.
*H01L 21/3065* (2006.01)
*H01J 37/32* (2006.01)
(Continued)

(52) U.S. Cl.
CPC .......... *H01L 21/3065* (2013.01); *H01J 37/32* (2013.01); *H01J 37/32082* (2013.01); *H01J 37/32091* (2013.01); *H01J 37/32165* (2013.01); *H01J 37/3244* (2013.01); *H01J 37/32458* (2013.01); *H01J 37/32798* (2013.01); *H01L 21/31116* (2013.01); *H01L 21/31144* (2013.01);
(Continued)

(58) Field of Classification Search
None
See application file for complete search history.

(56) References Cited

U.S. PATENT DOCUMENTS

2017/0178894 A1* 6/2017 Stone ................ H01L 21/6719
2021/0343539 A1* 11/2021 Suda ................. H01J 37/32449

FOREIGN PATENT DOCUMENTS

JP 8-181116 A 7/1996
JP 2004-356179 A 12/2004
(Continued)

OTHER PUBLICATIONS

International Search Report and Written Opinion mailed on Jul. 20, 2021, received for PCT Application PCT/JP2021/017481, filed on May 7, 2021, 9 pages including English Translation.

*Primary Examiner* — Jiong-Ping Lu
(74) *Attorney, Agent, or Firm* — XSENSUS LLP

(57) ABSTRACT

A technique increases verticality in etching. An etching method is a method for etching a target film with a plasma processing apparatus including a chamber and a substrate support located in the chamber to support a substrate, the substrate support holding a substrate that includes the target film, the target film including a patterned mask film having at least one opening. The etching method includes supplying a process gas containing an HF gas into the chamber, and etching the target film by: generating plasma from the process gas in the chamber with radio-frequency power having a first frequency, and applying a pulsed voltage periodically to the substrate support at a second frequency lower than the first frequency.

16 Claims, 9 Drawing Sheets

(51) Int. Cl.
   *H01L 21/311*      (2006.01)
   *H01L 21/3213*     (2006.01)
   *H01L 21/67*       (2006.01)

(52) U.S. Cl.
   CPC .. *H01L 21/32136* (2013.01); *H01L 21/32137* (2013.01); *H01L 21/32139* (2013.01); *H01L 21/67069* (2013.01); *H01J 2237/334* (2013.01)

(56) References Cited

FOREIGN PATENT DOCUMENTS

| | | |
|---|---|---|
| JP | 2016-207769 A | 12/2016 |
| JP | 2017-208387 A | 11/2017 |
| JP | 2019-46994 A | 3/2019 |
| TW | 201923896 A | 6/2019 |
| TW | 201929071 A | 7/2019 |
| TW | 202030797 A | 8/2020 |

\* cited by examiner

|  | First example | First reference example |
| --- | --- | --- |
| Width of recess RC (Around mask film MK) | 56 nm | 52 nm |
| Width of recess RC (Around underlying film UF) | 46 nm | 34 nm |

ETCHING METHOD AND ETCHING APPARATUS

CROSS-REFERENCE TO RELATED APPLICATIONS

The present application is a bypass continuation-in-part application of International Application No. PCT/JP2021/017481, filed May 7, 2021, the entire content of which is incorporated herein by reference. This application is also related to U.S. Ser. No. 17/666,570, entitled: ETCHING METHOD, filed on Feb. 8, 2022 and U.S. Ser. No. 17/092,376, entitled: SUBSTRATE PROCESSING METHOD AND SUBSTRATE PROCESSING APPARATUS, filed on Nov. 9, 2020, the entire contents of each are incorporated herein by reference.

FIELD

Exemplary embodiments of the present disclosure relate to an etching method and an etching apparatus.

BACKGROUND

Patent Literature 1 describes an etching method that uses a process gas containing a hydrocarbon gas and a hydrofluorocarbon gas as a process gas used in plasma etching.

CITATION LIST

Patent Literature

Patent Literature 1: Japanese Unexamined Patent Application Publication No. 2016-39310

BRIEF SUMMARY

Technical Problem

One or more aspects of the present disclosure are directed to a technique for increasing verticality in etching.

Solution to Problem

An etching method according to one exemplary embodiment of the present disclosure is a method for etching a target film with an etching apparatus. The etching apparatus includes a chamber and a substrate support located in the chamber to support a substrate that includes the target film, the target film including a patterned mask film having at least one opening. The etching method includes supplying a process gas containing an HF gas into the chamber, and etching the target film by: generating plasma from the process gas in the chamber with radio-frequency power having a first frequency, and applying a pulsed voltage periodically to the substrate support at a second frequency lower than the first frequency.

An etching method according to one exemplary embodiment of the present disclosure is a method for etching a target film with an etching apparatus. The plasma processing apparatus includes a chamber and a substrate support located in the chamber to support a substrate that includes the target film, the target film including a patterned mask film having at least one opening. The etching method includes supplying a process gas containing hydrogen and fluorine into the chamber, and etching the target film by: generating plasma from the process gas in the chamber with radio-frequency power having a first frequency, and applying a pulsed voltage periodically to the substrate support at a second frequency lower than the first frequency. The plasma contains a chemical species of hydrogen fluoride.

An etching apparatus according to one exemplary embodiment of the present disclosure is an apparatus for etching a target film. The etching apparatus includes a chamber, a gas supply unit that supplies a process gas to the chamber, a substrate support located in the chamber to support a substrate, the substrate support holding a substrate that includes the target film, the target film including a patterned mask film having at least one opening, and a controller. The controller performs control operations including supplying a process gas containing an HF gas into the chamber, and etching the target film by: generating plasma from the process gas in the chamber with radio-frequency power having a first frequency, and applying a pulsed voltage periodically to the substrate support at a second frequency lower than the first frequency.

Advantageous Effects

The etching method according to one exemplary embodiment of the present disclosure increases verticality in etching.

DETAILED DESCRIPTION

Figure 1:
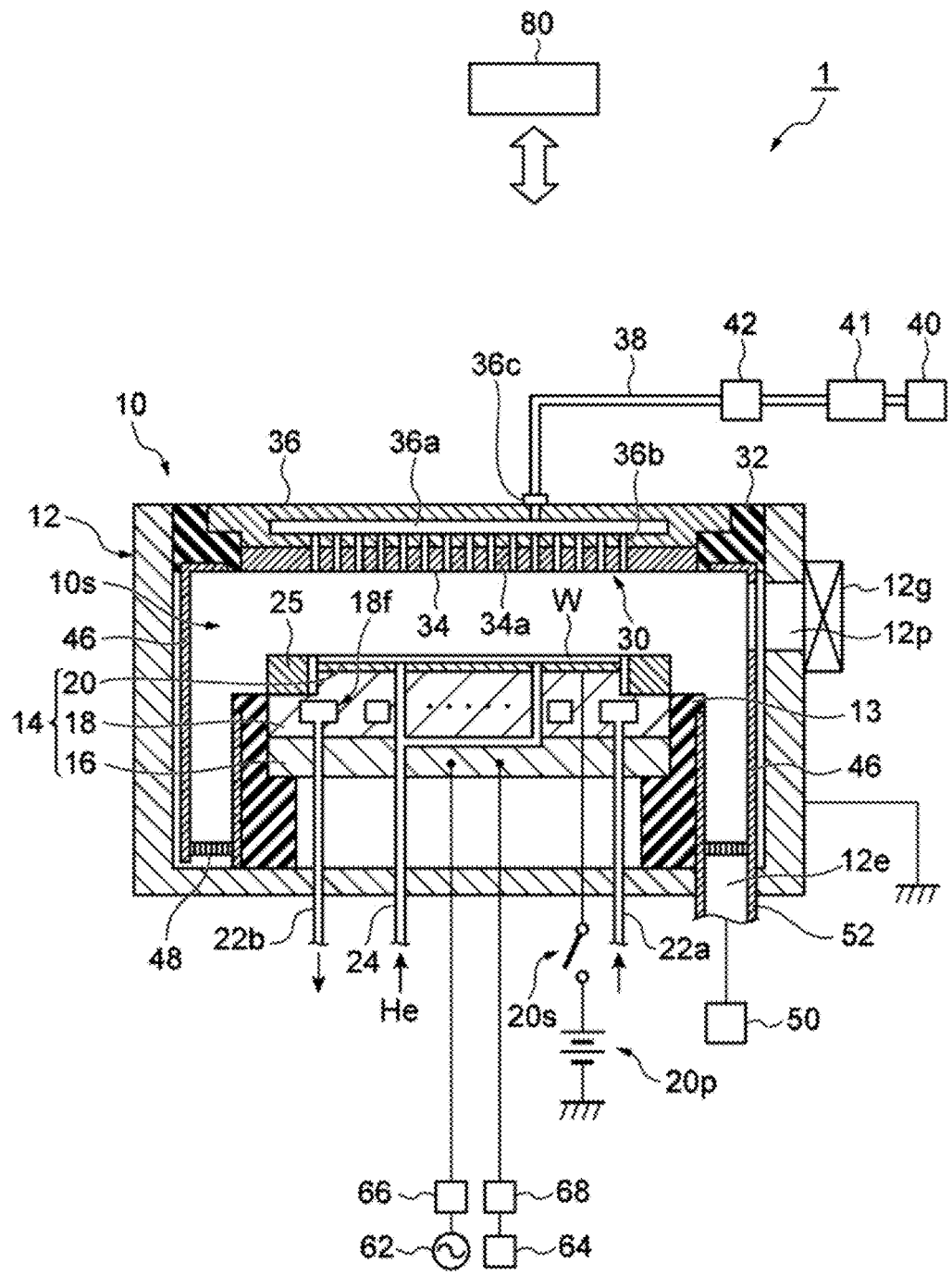
FIG. 1 is a schematic diagram of a plasma processing apparatus 1 for substrate processing according to one exemplary embodiment.

One or more embodiments of the present disclosure will be described below.

An etching method according to one exemplary embodiment is a method for etching a target film with an etching apparatus. The etching apparatus includes a chamber and a substrate support located in the chamber to support a substrate that includes the target film, the target film including a patterned mask film having at least one opening. The etching method includes supplying a process gas containing an HF gas into the chamber, and etching the target film by: generating plasma from the process gas in the chamber with radio-frequency power having a first frequency, and applying a pulsed voltage periodically to the substrate support at a second frequency lower than the first frequency.

In one exemplary embodiment, the process gas further contains a phosphorus-containing gas.

In one exemplary embodiment, the phosphorus-containing gas contains at least one selected from the group consisting of $PF_3$, $PCl_3$, $PF_5$, $PCl_5$, $POCl_3$, $PH_3$, $PBr_3$, and $PBr_5$.

In one exemplary embodiment, the process gas further contains $C_xH_yF_z$, where x and z are integers greater than or equal to 1, and y is an integer greater than or equal to 0.

In one exemplary embodiment, the process gas further contains a halogen-containing gas.

In one exemplary embodiment, the pulsed voltage is a negative voltage.

An etching method according to one exemplary embodiment is a method for etching a target film with an etching apparatus. The etching apparatus includes a chamber and a substrate support located in the chamber to support a substrate that includes the target film, the target film including a patterned mask film having at least one opening. The etching method includes supplying a process gas containing hydrogen and fluorine into the chamber, and etching the target film by: generating plasma from the process gas in the chamber with radio-frequency power having a first frequency, and applying a pulsed voltage periodically to the substrate support at a second frequency lower than the first frequency. The plasma contains a chemical species of hydrogen fluoride.

An etching apparatus according to one exemplary embodiment is an apparatus for etching a target film. The etching apparatus includes a chamber, a gas supply unit that supplies a process gas to the chamber, a substrate support located in the chamber to support a substrate, the substrate support holding a substrate that includes the target film, the target film including a patterned mask film having at least one opening, and a controller. The controller performs control operations including supplying a process gas containing an HF gas into the chamber, and etching the target film by: generating plasma from the process gas in the chamber with radio-frequency power having a first frequency, and applying a pulsed voltage periodically to the substrate support at a second frequency lower than the first frequency.

One or more embodiments of the present disclosure will now be described with reference to the drawings. In the figures, the same or similar components are given the same reference numerals, and may not be described repeatedly. Unless otherwise specified, the positional relationships shown in the drawings are used to describe the vertical, lateral, and other positions. The drawings are not drawn to scale relative to the actual ratio of each component, and the actual ratio is not limited to the ratio in the drawings.

Structure of Plasma Processing Apparatus 1

FIG. 1 is a schematic diagram of a plasma processing apparatus 1 according to one exemplary embodiment. The plasma processing apparatus 1 can perform, for example, etching. An etching method according to one exemplary embodiment (hereinafter referred to as the processing method) may be used by the plasma processing apparatus 1.

The plasma processing apparatus 1 shown in FIG. 1 includes a chamber 10. The chamber 10 has an internal space 10s. The chamber 10 includes a chamber body 12 that is substantially cylindrical. The chamber body 12 is formed from, for example, aluminum. The chamber body 12 has an inner wall coated with an anticorrosive film. The anticorrosive film may be a film of ceramic such as aluminum oxide or yttrium oxide.

The chamber body 12 has a side wall having a port 12p. A substrate W is transferred between the internal space 10s and the outside of the chamber 10 through the port 12p. The port 12p is open and closed by a gate valve 12g. The gate valve 12g is on the side wall of the chamber body 12.

A support 13 is located on the bottom of the chamber body 12. The support 13 is formed from an insulating material. The support 13 is substantially cylindrical. The support 13 extends upward from the bottom of the chamber body 12 into the internal space 10s. The support 13 supports a substrate support 14. The substrate support 14 supports the substrate W in the internal space 10s.

The substrate support 14 includes a lower electrode 18 and an electrostatic chuck (ESC) 20. The substrate support 14 may further include an electrode plate 16. The electrode plate 16 is substantially disk-shaped and is formed from a conductor such as aluminum. The lower electrode 18 is on the electrode plate 16. The lower electrode 18 is substantially disk-shaped and is formed from a conductor such as aluminum. The lower electrode 18 is electrically coupled to the electrode plate 16.

The ESC 20 is on the lower electrode 18. The substrate W is placed on the upper surface of the ESC 20. The ESC 20 includes a body and an electrode. The body of the ESC 20 is substantially disk-shaped and is formed from a dielectric. In the ESC 20, the electrode is a film electrode located in the body. The electrode in the ESC 20 is coupled to a direct-current (DC) power supply 20p through a switch 20s. A voltage is applied from the DC power supply 20p to the electrode in the ESC 20 to generate an electrostatic attraction between the ESC 20 and the substrate W. The substrate W is attracted to and held by the ESC 20 under the generated electrostatic attraction.

An edge ring 25 is placed on the substrate support 14. The edge ring 25 is annular. The edge ring 25 may be formed from silicon, silicon carbide, or quartz. The substrate W is placed in an area on the ESC 20 surrounded by the edge ring 25.

The lower electrode 18 has an internal channel 18f for carrying a heat-exchange medium (e.g., a refrigerant) being supplied through a pipe 22a from a chiller unit external to the chamber 10. The heat-exchange medium supplied to the channel 18f returns to the chiller unit through a pipe 22b. In the plasma processing apparatus 1, the temperature of the substrate W on the ESC 20 is adjusted through heat exchange between the heat-exchange medium and the lower electrode 18.

The plasma processing apparatus 1 includes a gas supply line 24. The gas supply line 24 supplies a heat-transfer gas (e.g., a He gas) from a heat-transfer gas supply assembly into a space between the upper surface of the ESC 20 and the back surface of the substrate W.

The plasma processing apparatus 1 further includes an upper electrode 30. The upper electrode 30 is located above the substrate support 14. The upper electrode 30 is supported in an upper portion of the chamber body 12 with a member 32. The member 32 is formed from an insulating material. The upper electrode 30 and the member 32 close a top opening of the chamber body 12.

The upper electrode 30 may include a ceiling plate 34 and a support member 36. The ceiling plate 34 has its lower surface exposed to and defining the internal space 10s. The ceiling plate 34 may be formed from a low resistance conductor or a semiconductor that generates less Joule heat. The ceiling plate 34 has multiple gas outlet holes 34a that are through-holes in the thickness direction.

The support member 36 supports the ceiling plate 34 in a detachable manner. The support member 36 is formed from a conductive material such as aluminum. The support member 36 has an internal gas-diffusion compartment 36a. The support member 36 has multiple gas holes 36b that extend downward from the gas-diffusion compartment 36a. The gas holes 36b communicate with the respective gas outlet holes 34a. The support member 36 has a gas inlet 36c. The gas inlet 36c is connected to the gas-diffusion compartment 36a. The gas inlet 36c is also connected to a gas supply pipe 38.

The gas supply pipe 38 is connected to a set of gas sources 40 through a set of flow controllers 41 and a set of valves 42. The flow controller set 41 and the valve set 42 are included in a gas supply unit. The gas supply unit may further include the gas source set 40. The gas source set 40 includes multiple gas sources. The gas sources include the sources of the process gas used with a method MT. The flow controller set 41 includes multiple flow controllers. The flow controllers in the flow controller set 41 are mass flow controllers or pressure-based flow controllers. The valve set 42 includes multiple open-close valves. The gas sources in the gas source set 40 are connected to the gas supply pipe 38 through the respective flow controllers in the flow controller set 41 and through the respective open-close valves in the valve set 42.

The plasma processing apparatus 1 includes a shield 46 along the inner wall of the chamber body 12 and along the periphery of the support 13 in a detachable manner. The shield 46 prevents a reaction product from accumulating on the chamber body 12. The shield 46 includes, for example, an aluminum base coated with an anticorrosive film. The anticorrosive film may be a film of ceramic such as yttrium oxide.

A baffle plate 48 is located between the support 13 and the side wall of the chamber body 12. The baffle plate 48 includes, for example, an aluminum member coated with an anticorrosive film (e.g., an yttrium oxide film). The baffle plate 48 has multiple through-holes. The chamber body 12 has an outlet 12e in its bottom below the baffle plate 48. The outlet 12e is connected to an exhaust device 50 through an exhaust pipe 52. The exhaust device 50 includes a pressure control valve and a vacuum pump such as a turbomolecular pump.

The plasma processing apparatus 1 includes a radio-frequency (RF) power supply 62 and a bias power supply 64. The RF power supply 62 generates RF power HF. The RF power HF has a first frequency suitable for generating plasma. The first frequency ranges from, for example, 27 to 100 MHz. The RF power supply 62 is coupled to the lower electrode 18 through an impedance matching circuit, or matcher 66, and through the electrode plate 16. The matcher 66 includes a circuit for matching the impedance of a load (the lower electrode 18) for the RF power supply 62 and the output impedance of the RF power supply 62. The RF power supply 62 may be coupled to the upper electrode 30 through the matcher 66. The RF power supply 62 serves as an exemplary plasma generator.

The bias power supply 64 generates an electrical bias. The bias power supply 64 is electrically coupled to the lower electrode 18. The electrical bias has a second frequency lower than the first frequency. The second frequency ranges from, for example, 400 kHz to 13.56 MHz. When used in addition to the RF power HF, the electrical bias is applied to the substrate support 14 to draw ions toward the substrate W.

In one example, the electrical bias is applied to the lower electrode 18. The electrical bias applied to the lower electrode 18 changes the potential of the substrate W on the substrate support 14 in periods defined by the second frequency. The electrical bias may be applied to a bias electrode located in the ESC 20.

In one embodiment, the electrical bias may be RF power LF with the second frequency. When used in addition to the RF power HF, the RF power LF serves as RF bias power for drawing ions toward the substrate W. The bias power supply 64 that generates RF power LF is coupled to the lower electrode 18 through an impedance matching circuit, or matcher 68, and through the electrode plate 16. The matcher 68 includes a circuit for matching the impedance of a load (the lower electrode 18) for the bias power supply 64 and the output impedance of the bias power supply 64.

The RF power LF alone may be used to generate plasma, without the RF power HF being used. In other words, a single RF power may be used to generate plasma. In this case, the RF power LF may have a frequency higher than 13.56 MHz, or for example, 40 MHz. In this case, the plasma processing apparatus 1 may not include the RF power supply 62 and the matcher 66. The bias power supply 64 serves as an exemplary plasma generator.

Figure 6:
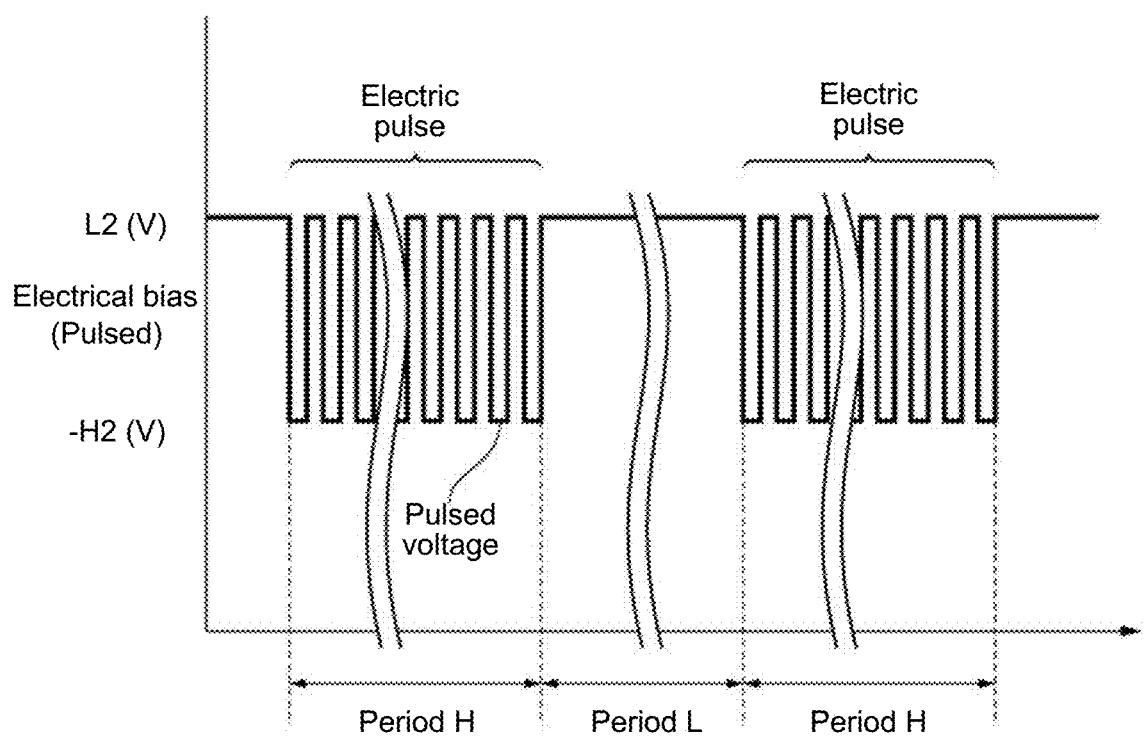
FIG. 6 is a timing chart showing an example pulsed voltage serving as electric pulses of the electrical bias (pulse wave).

In one embodiment, the electrical bias may be a pulsed voltage (refer to FIG. 6). In this case, the bias power supply may be a DC power supply. The bias power supply may apply a pulsed voltage or may include a device for pulsing the voltage downstream from the bias power supply. In one example, a pulsed voltage is applied to the substrate support 14 (the lower electrode 18 or a bias electrode 118) to cause the substrate W to have a negative potential. The pulsed voltage may have a square wave pulse, a triangular wave pulse, an impulse, or any other waveforms.

The pulsed voltage occurs in periods defined by the second frequency. Each period of the pulsed voltage includes two periods. The pulsed voltage is negative in one of the two periods. The voltage has a higher level (a greater absolute value) in one period than in the other period. The voltage may be negative or positive in the other period. The negative voltage in the other period may have a level higher than zero or a level of zero. In this embodiment, the bias power supply 64 is coupled to the lower electrode 18 through a low-pass filter and through the electrode plate 16. The bias power supply 64 may be coupled to the bias electrode 118 in the ESC 20, instead of being coupled to the lower electrode 18 (refer to FIG. 2).

In one embodiment, the bias power supply 64 may apply a continuous-wave electrical bias to the lower electrode 18. In other words, the bias power supply 64 may continuously apply the electrical bias to the lower electrode 18.

In some embodiments, the bias power supply 64 may apply a pulsed electrical bias to the lower electrode 18. The pulsed electrical bias may be periodically applied to the lower electrode 18. The pulsed electrical bias occurs in periods defined by a third frequency. The third frequency is lower than the second frequency. The third frequency ranges from, for example, 1 Hz to 200 kHz inclusive. In some embodiments, the third frequency may range from 5 Hz to 100 kHz inclusive.

Figure 5:
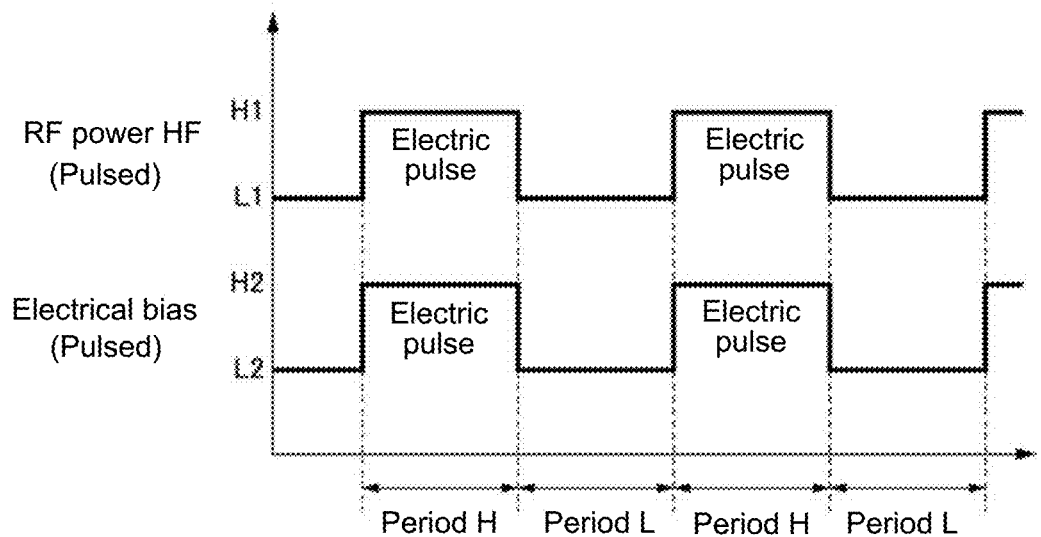
FIG. 5 is a timing chart showing example radio-frequency (RF) power HF and an example electrical bias.

Each period of the pulsed electrical bias includes two periods, or specifically, a period H and a period L (refer to FIG. 5). The electrical bias has a higher level (or a higher level of the pulsed electrical bias) in the period H than in the period L. In other words, the level of the electrical bias may be increased or decreased to apply a pulsed electrical bias to the lower electrode 18. The electrical bias may have a level higher than zero in the period L. In some embodiments, the electrical bias may have a level of zero in the period L. In other words, the pulsed electrical bias may be applied to the lower electrode 18 by repeatedly turning on and off the electrical bias applied to the lower electrode 18. When the electrical bias is RF power LF, the power level of the electrical bias is the same level as the power level of the RF power LF. The RF power LF used as the pulsed electrical bias has a level of 2 kW or more. When the electrical bias is a pulsed negative DC voltage, the power level of the electrical bias is a level equivalent to the effective value of the absolute value of the negative DC voltage. The duty ratio of the pulsed electrical bias, or the ratio of the period H to the period of the pulsed electrical bias, ranges from, for example, 1 to 80% inclusive. In some embodiments, the duty ratio of the pulsed electrical bias may range from 5 to 50% inclusive or 50 to 99% inclusive.

In one embodiment, the RF power supply 62 may provide continuous-wave RF power HF. In other words, the RF power supply 62 may continuously provide the RF power HF.

In some embodiments, the RF power supply 62 may provide pulsed-RF power HF. The pulsed-RF power HF may be provided periodically. The pulsed-RF power HF occurs in periods defined by a fourth frequency. The fourth frequency is lower than the second frequency. In one embodiment, the fourth frequency is the same as the third frequency. Each period of the pulsed-RF power HF includes two periods, or specifically, a period H and a period L. The RF power HF has a higher power level in the period H than in the other period, or the period L. The RF power HF may have a power level higher than zero or a power level of zero in the period L.

The periods of the pulsed-RF power HF may be synchronized with the periods of the pulsed electrical bias. The periods H of the pulsed-RF power HF may be synchronized with the periods H of the pulsed electrical bias. In some embodiments, the periods H of the pulsed-RF power HF may not be synchronized with the periods H of the pulsed electrical bias. The periods H of the pulsed-RF power HF may have the same durations as or may have durations different from the periods H of the pulsed electrical bias.

The gas supply unit supplies a gas into the internal space 10s for plasma processing in the plasma processing apparatus 1. The RF power HF, the electrical bias, or both are provided to form an RF electric field between the upper electrode 30 and the lower electrode 18. The resultant RF electric field generates plasma from the gas in the internal space 10s.

The plasma processing apparatus 1 may further include a controller 80. The controller 80 may be a computer including a processor, a storage such as a memory, an input device, a display, and an input-output interface for signals. The controller 80 controls the components of the plasma processing apparatus 1. An operator can use the input device in the controller 80 to input a command or perform other operations for managing the plasma processing apparatus 1. The display in the controller 80 can display and visualize the operating state of the plasma processing apparatus 1. The storage stores control programs and recipe data. The control program is executed by the processor to perform the processing in the plasma processing apparatus 1. The processor executes the control program to control the components of the plasma processing apparatus 1 in accordance with the recipe data.

The plasma generated in the plasma processing space may be capacitively coupled plasma (CCP), inductively coupled plasma (ICP), electron cyclotron resonance (ECR) plasma, helicon wave plasma (HWP), or surface wave plasma (SWP). Various plasma generators including an alternating-current (AC) plasma generator and a DC plasma generator may be used. In one embodiment, an AC signal (AC power) used in the AC plasma generator has a frequency in a range of 100 kHz to 10 GHz. Thus, the AC signal includes an RF signal and a microwave signal. In one embodiment, the RF signal has a frequency in a range of 200 kHz to 150 MHz.

Figure 2:
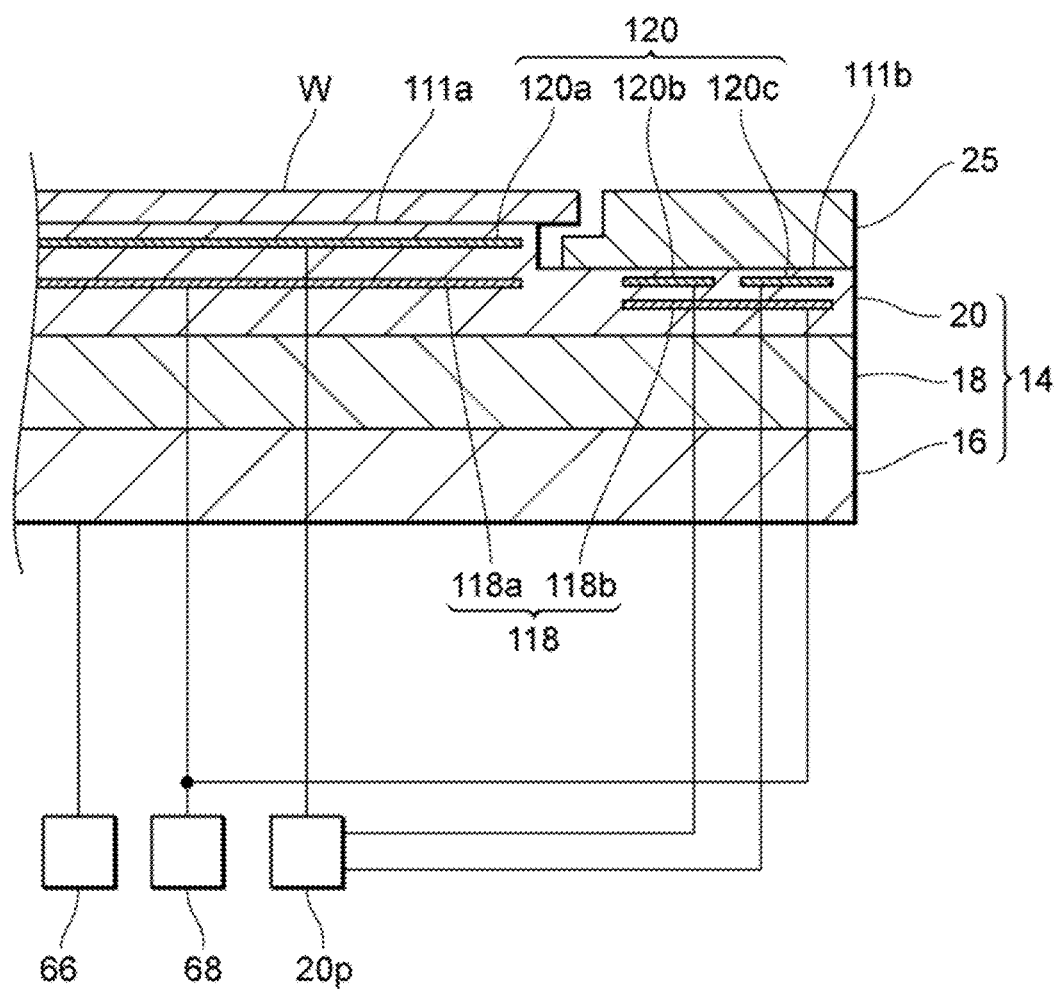
FIG. 2 is a partially enlarged view of a substrate support 14 included in the plasma processing apparatus 1.

FIG. 2 is a partially enlarged view of another example of the substrate support 14 included in the plasma processing apparatus 1. The substrate support 14 includes the electrode plate 16, the lower electrode 18, and the ESC 20. The upper surface of the ESC 20 includes a substrate support surface 111a being a central area for supporting the substrate W and an annular area 111b for supporting the edge ring 25. The annular area 111b surrounds the substrate support surface 111a. The substrate W is located on the substrate support surface 111a. The edge ring 25 is located on the annular area 111b to surround the substrate W on the substrate support surface 111a. The ESC 20 is located on the lower electrode 18. The upper surface of the ESC 20 includes the substrate support surface for supporting the substrate W.

The ESC 20 includes a chuck electrode 120 and the bias electrode 118 in the ESC 20. The chuck electrode 120 includes an electrode 120a located between the substrate support surface 111a and the lower electrode 18. The electrode 120a may be a flat electrode corresponding to the shape of the substrate support surface 111a. The chuck electrode 120 may include electrodes 120b and 120c located between the edge ring 25 and the lower electrode 18. The electrodes 120b and 120c may be annular electrodes corresponding to the shape of the edge ring 25. The electrode 120c is located outward from the electrode 120b. The electrodes 120b and 120c may serve as a bipolar ESC. The electrodes 120a, 120b, and 120c may be integral with one another. The DC power supply 20p may apply different DC voltages or the same DC voltage to the electrodes 120a, 120b, and 120c.

The bias electrode 118 includes an electrode 118a between the electrode 120a (or the substrate support surface 111a) and the lower electrode 18. The electrode 118a may be a flat electrode corresponding to the shape of the substrate support surface 111a, the electrode 120a, or both. The bias electrode 118 may include an electrode 118b located between the edge ring 25 and the lower electrode 18. Although not shown in the figures, the substrate support 14 may also include a temperature control module that adjusts at least one of an ESC 20, the edge ring 25, or the substrate to a target temperature. The temperature control module may include a heater, a heat-transfer medium, a channel, or a combination of these. The channel allows a heat-transfer fluid such as brine or gas to flow. The substrate support 14 may include a heat-transfer gas supply to supply a heat-transfer gas to a space between the back surface of the substrate W and the substrate support surface 111a, a space between the edge ring 25 and the annular area 111b, or both the spaces.

Exemplary Substrate W

Figure 3:
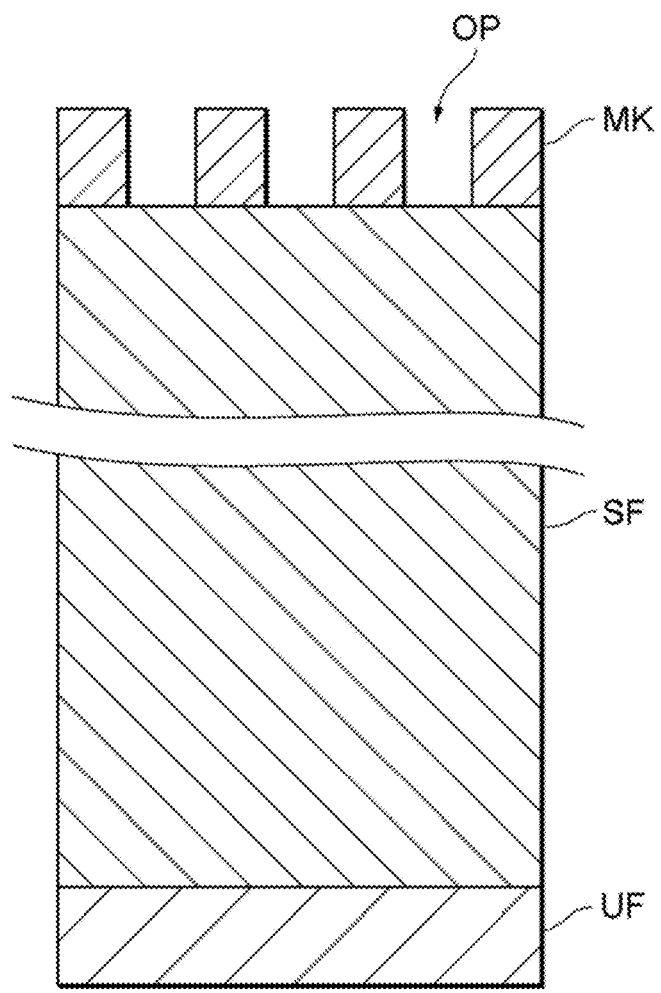
FIG. 3 is a diagram of a substrate W showing an example cross-sectional structure.

FIG. 3 is a diagram of the substrate W showing an example cross-sectional structure. The substrate W is an example of a substrate on which the processing method may be performed. The substrate W includes a silicon-containing film SF that is an example of a target film to be processed with the processing method. The substrate W may include an underlying film UF and a mask film MK. As shown in FIG.

3, the substrate W may include the underlying film UF, the silicon-containing film SF, and the mask film MK that are stacked in this order.

The underlying film UF may be an organic film, a dielectric film, a metal film, or a semiconductor film formed on a silicon wafer. The underlying film UF may be a silicon wafer. The underlying film UF may include multiple films that are stacked on one another.

The silicon-containing film SF may be a silicon-containing dielectric film. The silicon-containing dielectric film may include a silicon oxide film or a silicon nitride film. The silicon-containing dielectric film may be any other silicon-containing film with a different composition. The silicon-containing film SF may include a silicon film (e.g., a polycrystalline silicon film). The silicon-containing film SF may include at least one of a silicon nitride film, a polycrystalline silicon film, a carbon-containing silicon film, or a low dielectric constant film. The carbon-containing silicon film may include a SiC film, a SiOC film, or both the films. The low dielectric constant film may contain silicon and serve as an interlayer insulating film. The silicon-containing film SF may include at least two silicon-containing films different from each other. The at least two silicon-containing films may include a silicon oxide film and a silicon nitride film. The silicon-containing film SF may be, for example, a multilayer including an alternate stack of one or more silicon oxide films and one or more silicon nitride films. The silicon-containing film SF may be a multilayer including an alternate stack of multiple silicon oxide films and multiple silicon nitride films. In some embodiments, the at least two silicon-containing films may include a silicon oxide film and a silicon film. The silicon-containing film SF may be, for example, a multilayer including an alternate stack of one or more silicon oxide films and one or more silicon films. The silicon-containing film SF may be a multilayer including an alternate stack of multiple silicon oxide films and multiple polycrystalline silicon films. In some embodiments, the at least two silicon-containing films may include a silicon oxide film, a silicon nitride film, and a silicon film.

The mask film MK is located on the silicon-containing film SF. The mask film MK is formed from a material having a lower etching rate than the silicon-containing film SF in step ST2. The mask film MK may be formed from an organic material. More specifically, the mask film MK may contain carbon. The mask film MK may be formed from, for example, an amorphous carbon film, a photoresist film, or a spin-on-carbon (SOC) film. In some embodiments, the mask film MK may be formed from a silicon-containing film such as a silicon-containing antireflective film. In some embodiments, the mask film MK may be a metal-containing mask formed from a metal-containing material, such as titanium nitride, tungsten, or tungsten carbide.

In one example, the substrate W may include, as the silicon-containing film SF, a film stack including a silicon oxide film and a silicon nitride film stacked on the underlying film UF. In one example, the substrate W may also include, as the mask film MK, a polycrystalline silicon film, silicon boride, or tungsten carbide on the silicon nitride film. The mask film MK may be a multilayer resist including a polycrystalline silicon film, silicon boride, or tungsten carbide. In one example, the multilayer resist includes a mask including a hard mask on the polycrystalline silicon film. In one example, the hard mask includes a silicon oxide film (a tetraethoxysilane, or TEOS film). The silicon nitride film included in the film stack may be etched using a hard mask as its mask. The silicon oxide film included in the film stack may be etched using a polycrystalline silicon film as its mask.

The mask film MK is patterned to define at least one opening OP in the silicon-containing film SF. More specifically, the mask film MK has a pattern for etching the silicon-containing film SF in step ST2. Based on the pattern on the mask film MK defining the feature of the opening OP, a recess such as a hole or a trench is formed in the silicon-containing film SF. The recess in the silicon-containing film SF in step ST2 may have an aspect ratio of 20 or more, or 30, 40, or 50 or more. The mask film MK may have a line-and-space pattern.

Figure 4:
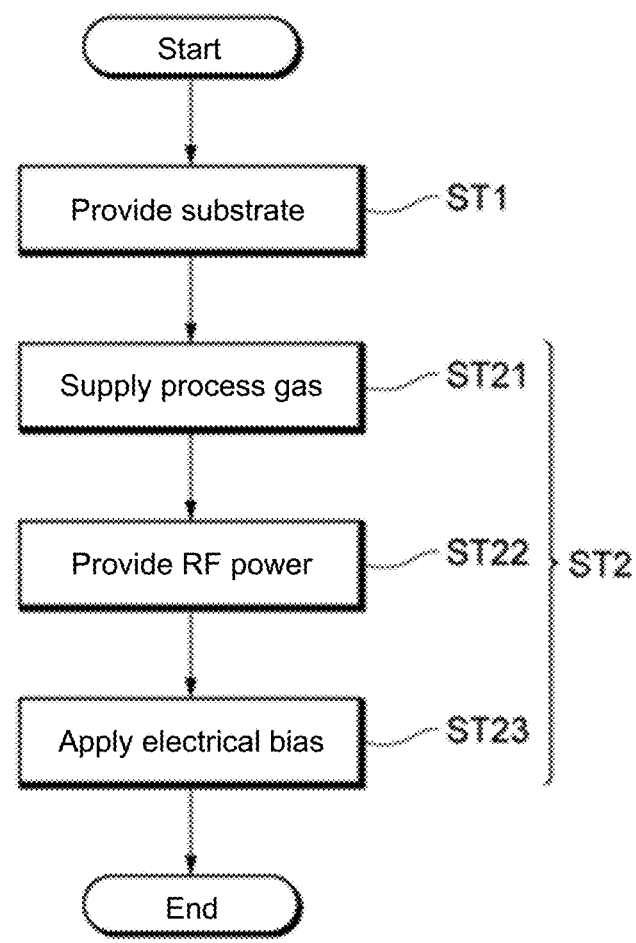
FIG. 4 is a flowchart of an etching method according to one exemplary embodiment.

FIG. 4 is a flowchart of an etching method (hereinafter also referred to as the processing method) according to one exemplary embodiment. The processing method is performed on the substrate W using, for example, the plasma processing apparatus 1 shown in FIGS. 1 and 2.

FIG. 5 is a timing chart showing example RF power HF and an example electrical bias. In FIG. 5, the RF power HF and the electrical bias are both provided in pulses. In one example, the RF power HF is specifically a pulse wave with electric pulses in the periods H. The electrical bias is a pulse wave with electric pulses in the periods H. In FIG. 5, the horizontal axis indicates time. In FIG. 5, the vertical axis indicates the power level of the RF power HF (e.g., the effective value of the power of the RF power HF) and the voltage level of the electrical bias (e.g., the effective value of the absolute value of the voltage of the electrical bias). The RF power HF at L1 indicates the RF power HF not being provided or being provided at a power level lower than at H1. The electrical bias at L2 indicates the electrical bias not being applied or being applied at a power level lower than at H2.

FIG. 6 is a timing chart showing an example pulsed voltage serving as electric pulses of the electrical bias (pulse wave). In FIG. 6, the horizontal axis indicates time. In FIG. 6, the vertical axis indicates the voltage value of the pulsed voltage serving as the electric pulses. In the present embodiment, the voltage of the electrical bias in the periods H (more specifically, the pulsed voltage to serve as the electrical bias) is a negative voltage. The power level of the RF power HF and the voltage level of the electrical bias in FIG. 5 do not represent the relative relationship between these levels, but may be set as appropriate. In the example in FIG. 5, the periods of the pulsed-RF power HF are synchronized with the periods of the pulsed electrical bias. The periods H of the pulsed-RF power HF have the same durations as the periods H of the pulsed electrical bias, and the periods L of the pulsed-RF power HF have the same durations as the periods L of the pulsed electrical bias. In one example, the periods H and the periods L of the pulsed-RF power HF may have durations offset from the durations of the periods H and the periods L of the pulsed electrical bias. In one example, the pulsed-RF power HF and the pulsed electrical bias may have opposite phases.

Example processing performed on the substrate W in FIG. 3 with the processing method shown in FIG. 4 will now be described with reference to the drawings. In the example below, the controller 80 in FIG. 1 controls the components of the plasma processing apparatus 1 to implement the processing method.

Step ST1: Preparation of Substrate

In step ST1, the substrate W is provided in the internal space 10s of the chamber 10. In the internal space 10s, the substrate W is placed on the substrate support surface 111a of the substrate support 14 and held by the ESC 20. The processing for forming each component of the substrate W may be at least partly performed in the internal space 10s. The substrate W may be loaded into the internal space 10s and placed on the substrate support surface 111a after the components of the substrate W are entirely or partially formed with an apparatus or in a chamber external to the plasma processing apparatus 1.

Step ST2: Etching

In step ST2, the silicon-containing film SF in the substrate W is etched. Step ST2 includes supplying a process gas (step ST21), providing RF power (step ST22), and applying an electrical bias. In step ST2, the silicon-containing film SF is etched with a chemical species (e.g., ions or radicals) contained in plasma generated from the process gas. In one example, the chemical species is a chemical species of hydrogen fluoride (an HF species). Steps ST21 to ST23 may be performed in any order. Steps ST21 to ST23 may be performed simultaneously or in parallel.

In step ST21, the process gas is supplied into the chamber 10. The process gas is used for etching a target film formed on the substrate W. The type of the process gas may be selected as appropriate based on, for example, the material of the target film, the material of the mask film, the material of the underlying film, the pattern on the mask film, or the depth of etching.

The process gas used in step ST21 contains a gas for generating an HF species. The process gas may contain an HF gas as an example of a gas for generating an HF species. In another example, the gas that generates an HF species may be $H_2$ and $C_sH_tF_u$ (s and u are positive integers, and t is an integer greater than or equal to 0) or $C_xH_yF_z$ (x, y, and z are positive integers). The process gas may contain a gas containing fluorine or another halogen in addition to a gas for generating an HF species. The process gas may contain at least one halogen-containing molecule. The process gas may contain at least one halogen-containing molecule of a fluorocarbon or a hydrofluorocarbon. The fluorocarbon may be, for example, at least one of $CF_4$, $C_3F_8$, $C_4F_6$, or $C_4F_8$. The hydrofluorocarbon may be, for example, at least one of $CH_2F_2$, $CHF_3$, or $CH_3F$. The hydrofluorocarbon may contain at least two carbon atoms. The hydrofluorocarbon may contain three or four carbon atoms. The hydrofluorocarbon may be, for example, at least one selected from the group consisting of $C_2HF_5$, $C_2H_2F_4$, $C_2H_3F_3$, $C_2H_4F_2$, $C_3HF_7$, $C_3H_2F_2$, $C_3H_2F_6$, $C_3H_2F_4$, $C_3H_3F_5$, $C_4H_5F_5$, $C_4H_2F_6$, $C_5H_2F_{10}$, and c-$C_5H_3F_7$. In one example, the carbon-containing gas is at least one selected from the group consisting of $C_4F_8$, $C_3H_2F_4$, and $C_4H_2F_6$. With a process gas containing a fluorocarbon, a hydrofluorocarbon or both, a chemical species of fluorine is generated in plasma and facilitates etching of the silicon-containing film SF together with a chemical species of hydrogen fluoride. In the plasma, the chemical species of carbon generated from the fluorocarbon, the hydrofluorocarbon, or both protects the mask film MK.

The halogen-containing molecule may not contain carbon. The halogen-containing molecule is, for example, a nitrogen trifluoride ($NF_3$) gas or a sulfur hexafluoride ($SF_6$) gas. The process gas may further contain a halogen-containing gas containing a non-fluorine halogen. The halogen-containing gas is, for example, at least one selected from the group consisting of $Cl_2$, $SiH_2Cl_2$, $SiCl_4$, $Si_2Cl_6$, $CHCl_3$, $CCl_4$, and $BCl_3$. In one example, the halogen-containing gas may be HBr or $N_{F3}$.

The process gas used in step ST21 may further contain at least one phosphorus-containing molecule. The phosphorus-containing molecule may be an oxide such as tetraphosphorus decaoxide ($P_4O_{10}$), tetraphosphorus octoxide ($P_4O_8$), or tetraphosphorus hexaoxide ($P_4O_6$). Tetraphosphorus decaoxide may also be called diphosphorus pentaoxide ($P_2O_5$). The phosphorus-containing molecule may be a halide (phosphorus halide) such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), or phosphorus iodide ($PI_3$). In other words, the phosphorus-containing molecule may be, for example, phosphorus fluoride containing fluorine as a halogen. In some embodiments, the phosphorus-containing molecule may contain a non-fluorine halogen. The phosphorus-containing molecule may be a phosphoryl halide such as phosphoryl fluoride ($POF_3$), phosphoryl chloride ($POCl_3$), or phosphoryl bromide ($POBr_3$). The phosphorus-containing molecule may be phosphine ($PH_3$), calcium phosphide (e.g., $Ca_3P_2$), phosphoric acid ($H_3PO_4$), sodium phosphate ($Na_3PO_4$), or hexafluorophosphoric acid ($HPF_6$). The phosphorus-containing molecule may be a fluorophosphine ($H_xPF_y$), where the sum of x and y is 3 or 5. The fluorophosphine may be, for example, $HPF_2$ or $H_2PF_3$. The process gas may contain at least one phosphorus-containing molecule of the above phosphorus-containing molecules. For example, the process gas may contain at least one phosphorus-containing molecule of $PF_3$, $PCl_3$, $PF_5$, $PCl_5$, $POCl_3$, $PH_3$, $PBr_3$, or $PBr_5$. Each phosphorus-containing molecule contained in the process gas in either liquid or solid form may be vaporized by, for example, heating before being supplied into the chamber 10.

The process gas used in step ST21 may further contain carbon and hydrogen. The process gas may contain at least one hydrogen-containing molecule of $H_2$, a hydrocarbon ($C_xH_y$), a hydrofluorocarbon ($C_xH_yF_z$), or $NH_3$. The $C_xH_y$ may be, for example, $CH_4$ or $C_3H_6$, where x and y are positive integers. The process gas may contain a hydrogen-containing molecule of a fluorocarbon or a hydrocarbon (e.g., $CH_4$). The process gas may further contain oxygen. The process gas may contain, for example, $O_2$. In some embodiments, the process gas may not contain oxygen.

The process gas used in step ST21 may contain a phosphorus-containing gas, a fluorine-containing gas, and a hydrogen-containing gas containing at least one selected from the group consisting of hydrogen fluoride, hydrogen ($H_2$), ammonia, and a hydrocarbon. The fluorine-containing gas may be a fluorocarbon, a hydrofluorocarbon, or both. The process gas may be a phosphorus-containing gas, a fluorine-containing gas, a hydrofluorocarbon gas, or a halogen-containing gas containing a non-fluorine halogen. The fluorine-containing gas is, for example, a nitrogen trifluoride ($NF_3$) gas or sulfur hexafluoride ($SF_6$) gas.

In step ST22, an RF power HF is provided to the lower electrode 18. As shown in, for example, FIG. 5, the RF power HF is a pulse wave with electric pulses in the periods H in which the power level is higher than in the periods L. The pulses in the RF power HF (pulse wave) have a frequency ranging from, for example, 27 to 100 MHz. When the RF power HF is provided to, for example, the lower electrode 18, plasma is generated from the process gas supplied into the chamber 10. In another embodiment, the RF power HF may be provided to the upper electrode (shower head) 30.

In step ST23, an electrical bias is applied to the bias electrode 118. As shown in, for example, FIG. 5, the electrical bias has a higher voltage level in the periods H than in the periods L. The electrical bias is a pulse wave with electric pulses in the periods H. In one example, the pulse wave has a frequency ranging from 5 to 100 kHz. As shown in FIG. 6, the electric pulse includes a pulsed voltage repeated at a predetermined frequency. In one example, the predetermined frequency is 400 kHz. The pulsed voltage may have a square wave pulse, a triangular wave pulse, an impulse, or any other waveforms. In the present embodiment, the pulsed voltage has a negative voltage in the periods H. The pulsed voltage has a higher voltage level in the periods L than in the periods H. The pulsed voltage may be any of a positive voltage, a negative voltage, or a zero voltage.

In the periods H, when the RF power HF provided to the lower electrode 18 generates plasma and the electrical bias is applied to the bias electrode 118, an active species such as positive ions positively charged in the plasma is drawn to the substrate W placed on the substrate support surface 111a. The active species passes through the opening OP formed in the mask film MK and strikes the silicon-containing film SF. The silicon-containing film SF is thus etched in a portion exposed in the opening OP. This forms a recess or a hole in the silicon-containing film SF.

Examples of the processing method will now be described.

First Example

In the first example, a film stack including a silicon oxide film and a silicon nitride film was etched for 10 minutes under the conditions below.

Process gas: HF, $PF_3$, $Cl_2$, HBr, $NF_3$, and $CH_2F_2$
RF power HF: 40 MHz, 3300 W
Electrical bias: 400 kHz, 6000 V

First Reference Example

In a reference example, a film stack including a silicon oxide film and a silicon nitride film was etched for 10 minutes with RF power LF instead of the electrical bias in the first example. The other conditions are the same as in the first example.

Figure 7:
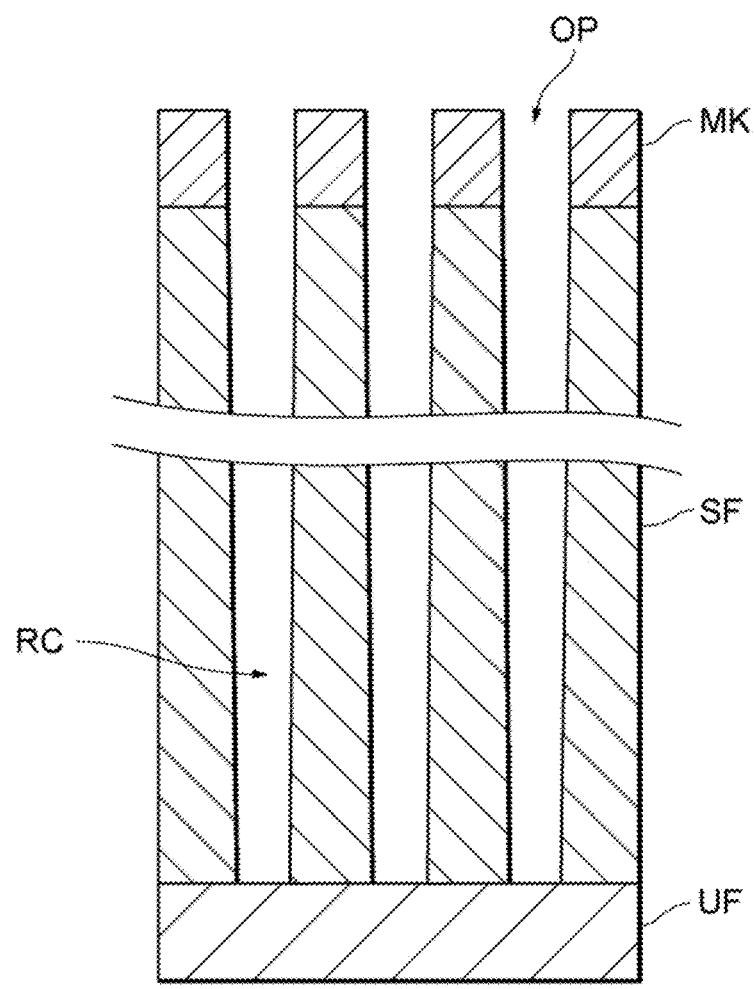
FIG. 7 is a schematic cross-sectional view of the substrate W after etching of a silicon-containing film SF under conditions in a first example.
Figure 8:
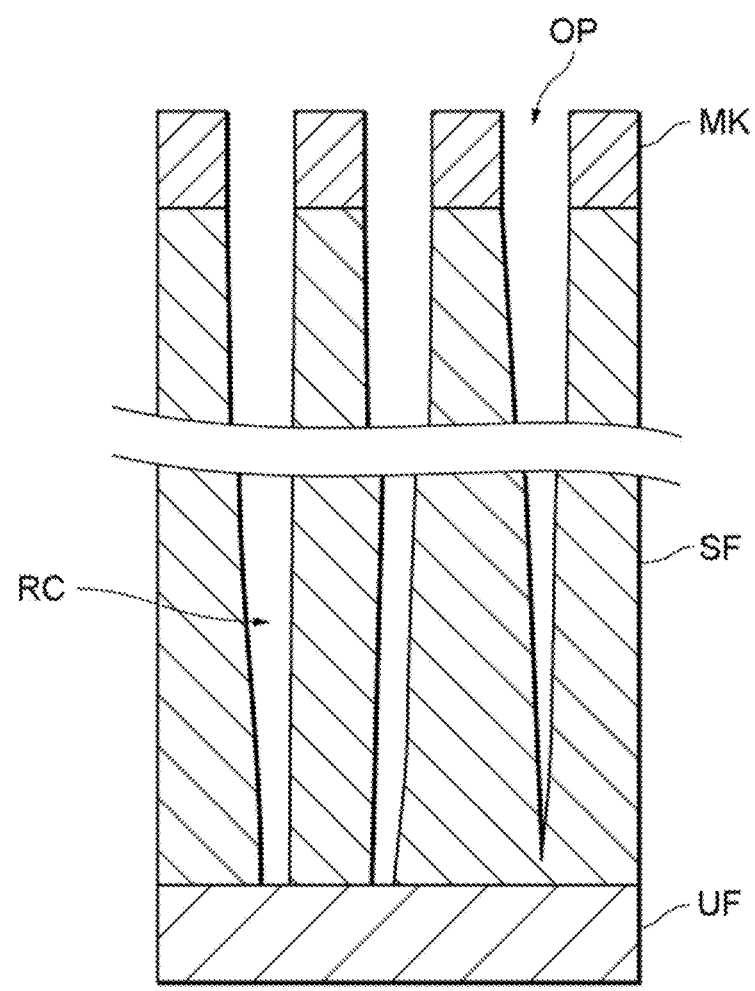
FIG. 8 is a schematic cross-sectional view of the substrate W after etching of a silicon-containing film SF under conditions in a first reference example.

Process gas: HF, $PF_3$, $Cl_2$, HBr, $NF_3$, and $CH_2F_2$
RF power HF: 40 MHz, 3300 W
RF power LF: 400 kHz, 14000 W FIG. 7 is a schematic cross-sectional view of the substrate W after etching of the silicon-containing film SF (the film stack including the silicon oxide film and the silicon nitride film) under the conditions in the first example. FIG. 8 is a schematic cross-sectional view of the substrate W after etching of the silicon-containing film SF (the film stack including the silicon oxide film and the silicon nitride film) in the first reference example. As shown in FIG. 7, recesses RC have an intended level of verticality (fewer bends) in the first example. Each recess RC also has a sufficient width at the lower end. As shown in FIG. 8, recesses RC bend more in the first reference example than in the first example. With, for example, some recesses RC not reaching the underlying film UF, each recess RC is narrower particularly at around the lower end. These results will be described based on specific numerical values.

Figure 9:
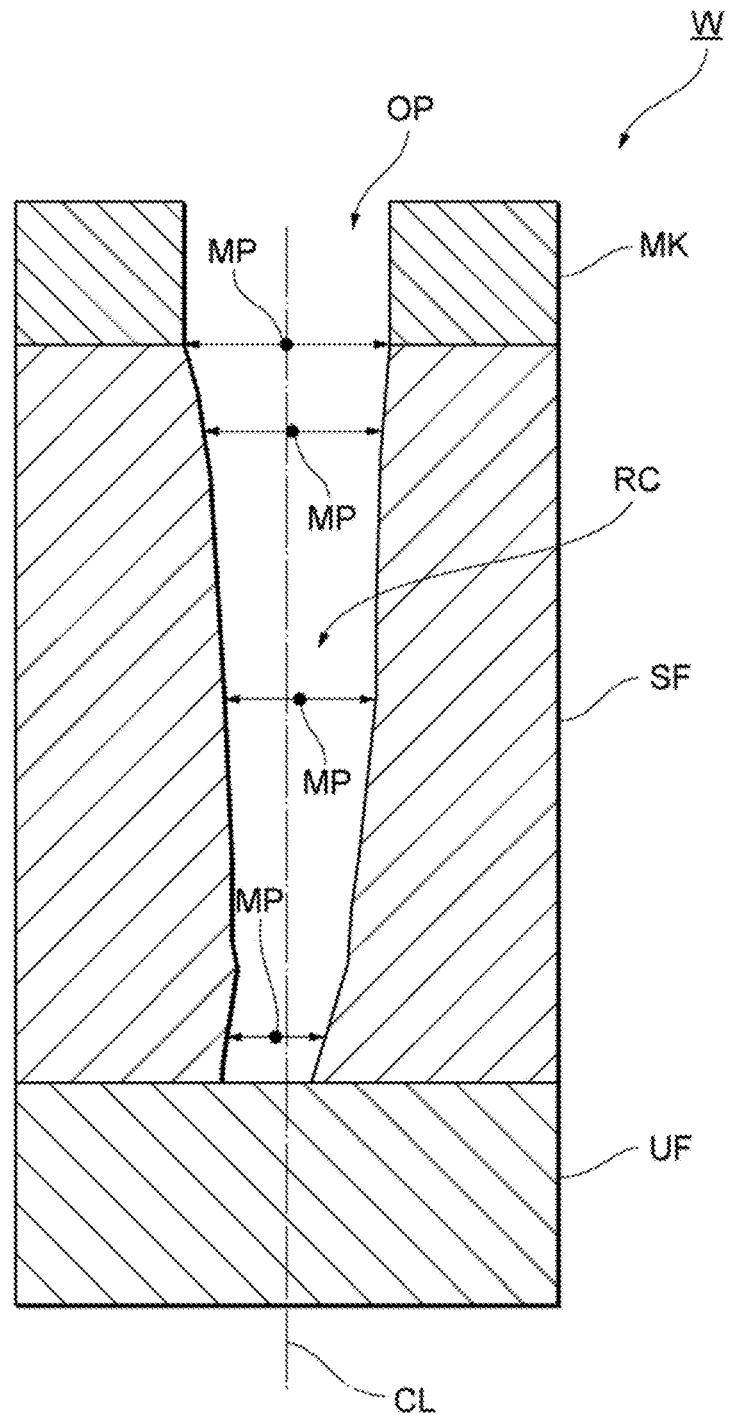
FIG. 9 is a diagram describing an example method for evaluating the cross-sectional feature of a recess RC.

FIG. 9 is a diagram describing an example method for evaluating the cross-sectional feature of the recess RC. In FIG. 9, a center reference line CL extends through a midpoint MP of the width of the recess RC on the lower surface of the mask film MK or on the upper surface of the silicon-containing film SF. The misalignment amount of the midpoint MP from the central reference line CL is measured in the depth direction of the recess RC to evaluate the feature of the recess RC. For example, the misalignment amount can be used to evaluate bending or twisting of the recess RC formed in the silicon-containing film SF.

Figures 10, 11:
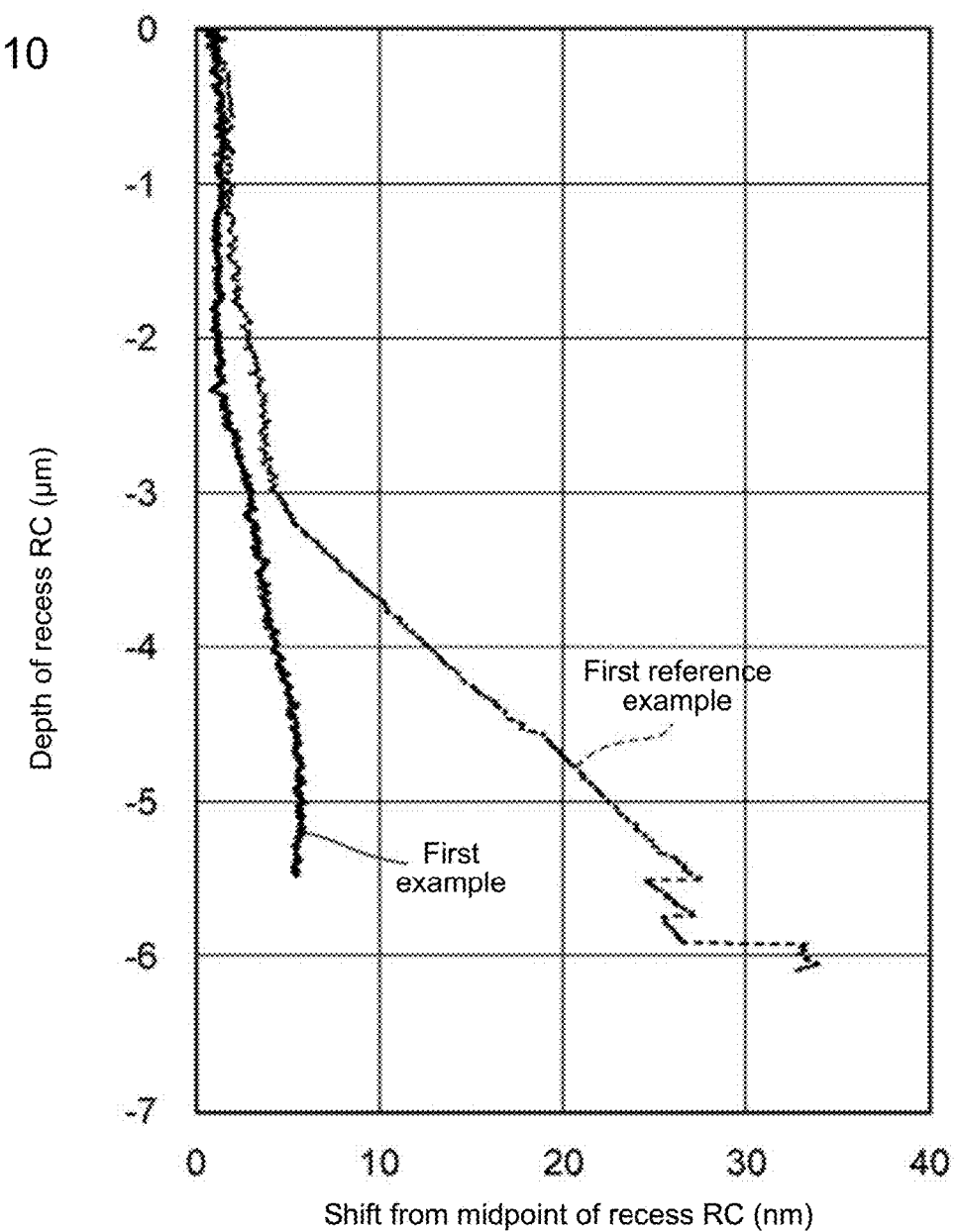
FIG. 10 is a graph showing the degree of bending in the cross-sectional features of recesses RC in the first example and in the first reference example.
FIG. 11 is a table showing the width (CD) of the recesses RC in the first example and in the first reference example.

FIG. 10 is a graph showing the degree of bending in the cross-sectional features of the recesses RC in the first example and in the first reference example. More specifically, FIG. 10 is a graph showing the misalignment amount of midpoints MP from the center reference line CL in the first example and in the first reference example. Each midpoint MP is at the middle of the corresponding width of the recess RC obtained from etching of the silicon-containing film SF (the film stack including a silicon oxide film and a silicon nitride film). In FIG. 10, the vertical axis indicates the depth of the recess RC in the silicon-containing film SF. The horizontal axis indicates the misalignment amount of the midpoint MP of the width of the recess RC from the center reference line CL. As shown in FIG. 10, the midpoints MP in the first example are misaligned by a maximum of about 5 nm from the center reference line CL. In the first reference example, the midpoints MP are misaligned greatly from the center reference line CL particularly at the depth of about 3 µm or deeper, and the recess RC bends greatly in a cross-sectional view.

FIG. 11 is a table showing the width (critical dimension or CD) of the recess RC in the first example and in the first reference example. As shown in FIG. 11, the recess RC in the first example has a width at around the underlying film UF (in other words, at around the lower end of the recess RC) reduced with a lesser degree from the width at around the mask film MK (in other words, at around the upper end of the recess RC). In contrast, the recess RC in the first reference example has a width at around the underlying film UF (in other words, at around the lower end of the recess RC) reduced greatly from the width at around the mask film MK (in other words, at around the upper end of the recess RC).

Second Example

In a second example, a film stack including a silicon oxide film and a silicon nitride film was etched for 10 minutes under the conditions below.

Process gas: HF and $C_4F_8$
RF power HF: 40 MHz, 5500 W
Electrical bias: 400 kHz, 6000 V

Second Reference Example

In a reference example, RF power LF was used instead of the electrical bias in the second example for etching a film stack including a silicon oxide film and a silicon nitride film for 10 minutes. The other conditions are the same as in the second example.

Process gas: HF and $C_4F_8$
RF power HF: 40 MHz, 5500 W
RF power LF: 400 kHz, 10000 W After the etching in the second example and in the second reference example, the cross section of each silicon-containing film SF (the film stack including the silicon oxide film and the silicon nitride film) was examined. As in the first example (FIG. 7), the recesses RC in the second example showed intended verticality (fewer bends) each with a sufficient width at the lower end. As in the first reference example (FIGS. 8 and 10), the recesses RC in the second reference example bend more at deeper portions. In the second reference example, each recess RC has a reduced width particularly at around its lower end, with, for example, some recesses RC not reaching the underlying film UF.

The above embodiments have been described by way of example, and various modifications may be made without departing from the spirit and scope of the present disclosure. For example, the processing method may be performed with, in addition to the plasma processing apparatus 1 using capacitively coupled plasma, a plasma processing apparatus using any plasma source for, for example, inductively coupled plasma or microwave plasma.

REFERENCE SIGNS LIST

1 Plasma processing apparatus
10 Chamber
10s Internal space
12 Chamber body
14 Substrate support
16 Electrode plate
18 Lower electrode
20 Electrostatic chuck (ESC)
30 Upper electrode
50 Exhaust device
62 Radio-frequency (RF) power supply
64 Bias power supply
80 Controller
SF Silicon-containing film
MK Mask film
OP Opening
PF Protective film
RC Recess
UF Underlying film
W Substrate

The invention claimed is:

1. An etching method for etching a target film with a plasma processing apparatus, the target film including a patterned mask film having at least one opening, the plasma processing apparatus including a chamber and a substrate support in the chamber, the substrate support containing a first electrode and a second electrode, the substrate support configured to hold a substrate that includes the target film, the etching method comprising:
supplying a process gas containing a hydrogen fluoride gas into the chamber; and
generating plasma from the process gas in the chamber by applying a pulsed radio-frequency power and a constant bias power to the first electrode in the substrate support, the pulsed radio-frequency power having a first frequency and a first pulse rate, the constant bias power having a second frequency, lower than the first frequency, wherein the pulsed radio-frequency power is applied in accordance with a first periodic cycle; and
etching an unmasked portion of the target film while the plasma is in generating in the chamber by applying a pulsed negative DC voltage relative to the constant bias power to the second electrode in the substrate support, the pulsed negative DC voltage having a second pulse rate, wherein the pulsed negative DC voltage is applied in accordance with a second periodic cycle.

2. The etching method according to claim 1, wherein the process gas further contains one of:
a phosphorus-containing gas that contains at least one selected from the group consisting of $PF_3$, $PCl_3$, $PF_5$, $PCl_5$, $POCl_3$, $PH_3$, $PBr_3$, and $PBr_5$,
$C_xH_yF_z$, where x and z are integers greater than or equal to 1, and y is an integer greater than or equal to 0, or
a halogen-containing gas.

3. The etching method according to claim 1, wherein
the first frequency is in an inclusive range of 27 MHz through 100 MHz, and
the second frequency is in an inclusive range of 400 kHz through 13.56 MHz.

4. The etching method according to claim 1, wherein
the second pulse rate has a third frequency that ranges from 1 kHz to 200 kHz.

5. The etching method according to claim 4, wherein
the first pulse rate has a fourth frequency that ranges from 1 kHz to 200 kHz.

6. The etching method according to claim 1, wherein
in the first periodic cycle, a level of the pulsed radio-frequency power at a first period of the first periodic cycle is higher than a level of the pulsed radio-frequency power at a second period of the first periodic cycle, and
in the second periodic cycle, the pulsed negative DC voltage is applied in a first period of the second periodic cycle and the pulsed negative DC voltage is not applied in a second period of the second periodic cycle.

7. The etching method according to claim 6, wherein
a ratio of the first period of the second periodic cycle to a total of the first period of the second periodic cycle and the second period of the second periodic cycle ranges from 1% to 80%.

8. The etching method according to claim 6, wherein
the first period of the first periodic cycle and the second period of the first periodic cycle are equal to the first period of the second periodic cycle and the second period of the second periodic cycle, respectively.

9. The etching method according to claim 6, wherein
the first period of the first periodic cycle and the second period of the first periodic cycle are different from the first period of the second periodic cycle and the second period of the second periodic cycle, respectively.

10. The etching method according to claim 1, wherein
the first periodic cycle is asynchronous with the second periodic cycle, or
the first periodic cycle is synchronous with the second periodic cycle.

11. An etching method for etching a target film with a plasma processing apparatus, the target film including a patterned mask film having at least one opening, the plasma processing apparatus including a chamber and a substrate support in the chamber, the substrate support containing a first electrode and a second electrode, the substrate support configured to hold a substrate that includes the target film, the etching method comprising:
supplying a process gas containing hydrogen and fluorine into the chamber; and
generating plasma from the process gas in the chamber by applying a constant radio-frequency power and a constant bias power to the first electrode in the substrate support, the constant radio-frequency power having a first frequency, the constant bias power having a second frequency, lower than the first frequency; and
etching an unmasked portion of the target film while the plasma is in generating in the chamber by applying a pulsed negative DC voltage relative to the constant bias power to the second electrode in the substrate support, the pulsed negative DC voltage having a predetermined pulse rate, wherein the pulsed negative DC voltage is applied in accordance with a predetermined periodic cycle.

12. The etching method according to claim 11, wherein the process gas further contains one of:

a phosphorus-containing gas that contains at least one selected from the group consisting of $PF_3$, $PCl_3$, $PF_5$, $PCl_5$, $POCl_3$, $PH_3$, $PBr_3$, and $PBr_5$, $C_xH_yF_z$, where x and z are integers greater than or equal to 1, and y is an integer greater than or equal to 0, or a halogen-containing gas.

13. The etching method according to claim 11, wherein
the first frequency is in an inclusive range of 27 MHz through 100 MHz, and
the second frequency is in an inclusive range of 400 kHz through 13.56 MHz.

14. The etching method according to claim 11, wherein the predetermined pulse rate has a third frequency that ranges from 1 kHz to 200 kHz.

15. The etching method according to claim 11, wherein in the second periodic cycle, the pulsed negative DC voltage is applied in a first period of the second periodic cycle and the pulsed negative DC voltage is not applied in a second period of the second periodic cycle.

16. The etching method according to claim 15, wherein a ratio of the first period of the second periodic cycle to a total of the first period of the second periodic cycle and the second period of the second periodic cycle ranges from 1% to 80%.

* * * * *